United States Patent
Kuo et al.

(10) Patent No.: US 10,832,749 B2
(45) Date of Patent: Nov. 10, 2020

(54) PERPENDICULAR MAGNETIC MEMORY WITH SYMMETRIC FIXED LAYERS

(71) Applicant: Intel Corporation, Santa Clara, CA (US)

(72) Inventors: Charles C. Kuo, Hillsboro, OR (US); Justin S. Brockman, Portland, OR (US); Juan G. Alzate Vinasco, Portland, OR (US); Kaan Oguz, Beaverton, OR (US); Kevin P. O'Brien, Portland, OR (US); Brian S. Doyle, Portland, OR (US); Mark L. Doczy, Portland, OR (US); Satyarth Suri, Portland, OR (US); Robert S. Chau, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 266 days.

(21) Appl. No.: 15/735,625

(22) PCT Filed: Jun. 26, 2015

(86) PCT No.: PCT/US2015/038035
§ 371 (c)(1),
(2) Date: Jan. 8, 2018

(87) PCT Pub. No.: WO2016/209272
PCT Pub. Date: Dec. 29, 2016

(65) Prior Publication Data
US 2020/0043536 A1 Feb. 6, 2020

(51) Int. Cl.
*H01L 27/22* (2006.01)
*H01L 43/08* (2006.01)
(Continued)

(52) U.S. Cl.
CPC .......... *G11C 11/161* (2013.01); *H01L 27/222* (2013.01); *H01L 43/08* (2013.01);
(Continued)

(58) Field of Classification Search
CPC ......... H01L 27/22; H01L 43/08; H01L 43/10; H01L 43/12; G11C 11/161; G11C 2211/5616
See application file for complete search history.

(56) References Cited

U.S. PATENT DOCUMENTS 7,782,659 B2 * 8/2010 Ho ........................ H01L 27/228
365/158
8,169,816 B2 * 5/2012 Min ...................... H01L 27/228
365/158
(Continued)

FOREIGN PATENT DOCUMENTS

JP 2015032713 A 2/2015

OTHER PUBLICATIONS

European Patent Office, Extended European Search Report dated Jan. 23, 2019 in European Patent No. 15896558.2, nine pages.
(Continued)

*Primary Examiner* — Ida M Soward
(74) *Attorney, Agent, or Firm* — Trop, Pruner & Hu, P.C.

(57) ABSTRACT

An embodiment includes an apparatus including: a substrate; a perpendicular magnetic tunnel junction (pMTJ), on the substrate, including a first fixed layer, a second fixed layer, and a free layer between the first and second fixed layers; a first dielectric layer between the first fixed layer and the free layer; and a second layer between the second fixed layer and the free layer. Other embodiments are described herein.

25 Claims, 4 Drawing Sheets

(51) Int. Cl.
    *H01L 43/10*     (2006.01)
    *H01L 43/12*     (2006.01)
    *G11C 11/16*     (2006.01)

(52) U.S. Cl.
    CPC .............. *H01L 43/10* (2013.01); *H01L 43/12* (2013.01); *G11C 2211/5616* (2013.01)

(56) References Cited

U.S. PATENT DOCUMENTS

| | | | | |
|---|---|---|---|---|
| 8,726,491 | B2 * | 5/2014 | Horng | H01L 43/10 29/603.14 |
| 9,093,640 | B2 * | 7/2015 | Aggarwal | H01L 43/12 |
| 9,159,906 | B2 * | 10/2015 | Whig | H01L 43/08 |
| 9,299,920 | B2 * | 3/2016 | Kim | H01L 43/08 |
| 9,601,687 | B2 * | 3/2017 | Park | H01L 43/10 |
| 9,660,183 | B2 * | 5/2017 | Wang | H01L 43/08 |
| 9,735,348 | B2 * | 8/2017 | Kuo | H01L 43/10 |
| 9,972,774 | B2 * | 5/2018 | Tahmasebi | H01L 43/08 |
| 9,978,931 | B2 * | 5/2018 | Hu | H01L 43/08 |
| 2006/0141640 | A1 | 6/2006 | Huai et al. | |
| 2007/0086121 | A1 | 4/2007 | Nagase et al. | |
| 2008/0007994 | A1 | 1/2008 | Guo | |
| 2008/0088980 | A1 | 4/2008 | Kitagawa et al. | |
| 2008/0094886 | A1 | 4/2008 | Ranjan et al. | |
| 2008/0225585 | A1 | 9/2008 | Ranjan et al. | |
| 2011/0007560 | A1 | 1/2011 | Dieny et al. | |
| 2011/0031569 | A1 | 2/2011 | Watts et al. | |
| 2011/0062537 | A1 | 3/2011 | Oh et al. | |
| 2011/0069535 | A1 | 3/2011 | Clinton et al. | |
| 2011/0303997 | A1 | 12/2011 | Wang et al. | |
| 2012/0032288 | A1 | 2/2012 | Tomioka | |
| 2013/0134534 | A1 | 5/2013 | Sbiaa et al. | |
| 2014/0056061 | A1 | 2/2014 | Khvalkovskiy et al. | |
| 2014/0061828 | A1 | 3/2014 | Lim et al. | |
| 2014/0192591 | A1 * | 7/2014 | Keshtbod | B82Y 10/00 365/158 |
| 2015/0008547 | A1 | 1/2015 | Pi et al. | |
| 2015/0091110 | A1 | 4/2015 | Kuo et al. | |
| 2015/0129996 | A1 | 5/2015 | Tang et al. | |
| 2015/0129997 | A1 | 5/2015 | Tang et al. | |
| 2015/0171316 | A1 | 6/2015 | Park et al. | |
| 2015/0228321 | A1 * | 8/2015 | Lee | G11C 11/1675 365/158 |
| 2016/0148975 | A1 | 5/2016 | Kato et al. | |

OTHER PUBLICATIONS

International Application No. PCT/US2015/038012, filed Jun. 26, 2015 and entitled "Low Stray Field Magnetic Memory" by Brian S. Doyle, et al.

Wang et al., "Impact of Stray Field on the Switching Properties of Perpendicular MTJ for Scaled MRAM," 2012, pp. 29.2.1 to 29.2.4, Institute of Electrical and Electronics Engineers.

The International Searching Authority, "Written Opinion of the International Searching Authority and the International Search Report" as dated Mar. 25, 2016 in International Application No. PCT/US2015/038035.

Iba et al, "Top-pinned Perpendicular MTJ Structure with a Counter Bias Magnetic Field Layer for Suppressing a Stray-Field in Highly Scalable STT-MRAM," 2013, pp. T136-T137, Symposium on VLSI Technology Digest of Technical Papers.

International Application No. PCT/US2015/036266, filed Jun. 17, 2015 and entitled "Random Number Generator" by Charles C. Kuo, et al.

Taiwanese Patent Office, First Office Action and Search Report dated Mar. 24, 2020 in Taiwanese Patent Application No. 105115996, 9 pages total.

* cited by examiner

300

305
Forming a pMTJ stack including fixed layers above and below a free layer, wherein the one of the fixed layers is more stable ($K_{eff}$) than the other fixed layer.

310
Magnetic soaking the stack to orientate the magnetization of both pinned layers in a first direction.

315
Exposing the fixed layers to a large polarized (e.g., negative) external field so the moments of the fixed layers lie in the same direction (e.g., spin down).

320
Exposing the fixed layers to a polarized external field so that the less stable of the two fixed layers reverses its magnetic moment (e.g., changes from spin down to spin up) but the more stable of the two fixed layers maintains its previous magnetic moment (e.g., spin down) to orient the two fixed layers in an AP orientation.

Figure 3

PERPENDICULAR MAGNETIC MEMORY WITH SYMMETRIC FIXED LAYERS

TECHNICAL FIELD

Embodiments of the invention are in the field of semiconductor devices and, in particular, magnetic memory.

BACKGROUND

As described in U.S. Patent Application Publication 2015/0091110, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

The operation of spin torque devices is based on the phenomenon of spin transfer torque (STT). If a current is passed through a magnetization layer, called the fixed magnetic layer, the current output from the magnetization layer will be spin polarized. With the passing of each electron, its spin (angular momentum) will be transferred to the magnetization in the next magnetic layer, called the free magnetic layer, and will cause a small change on its magnetization. This is, in effect, a torque-causing precession of magnetization. Due to reflection of electrons, a torque is also exerted on the magnetization of an associated fixed magnetic layer. In the end, if the current exceeds a certain critical value (which is a function of damping caused by the magnetic material and its environment), the magnetization of the free magnetic layer will be switched by a pulse of current, typically in about 1-10 nanoseconds. Magnetization of the fixed magnetic layer may remain unchanged since an associated current is below its threshold due to geometry or due to an adjacent anti-ferromagnetic layer.

Spin-transfer torque can be used to flip the active elements in magnetic random access memory. Spin-transfer torque memory (STTM) has the advantages of lower power consumption and better scalability over conventional magnetic random access memory (MRAM) which uses magnetic fields to flip the active elements.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements:

FIG. 3 includes a method in an embodiment of the invention.

DETAILED DESCRIPTION

Figure 1:
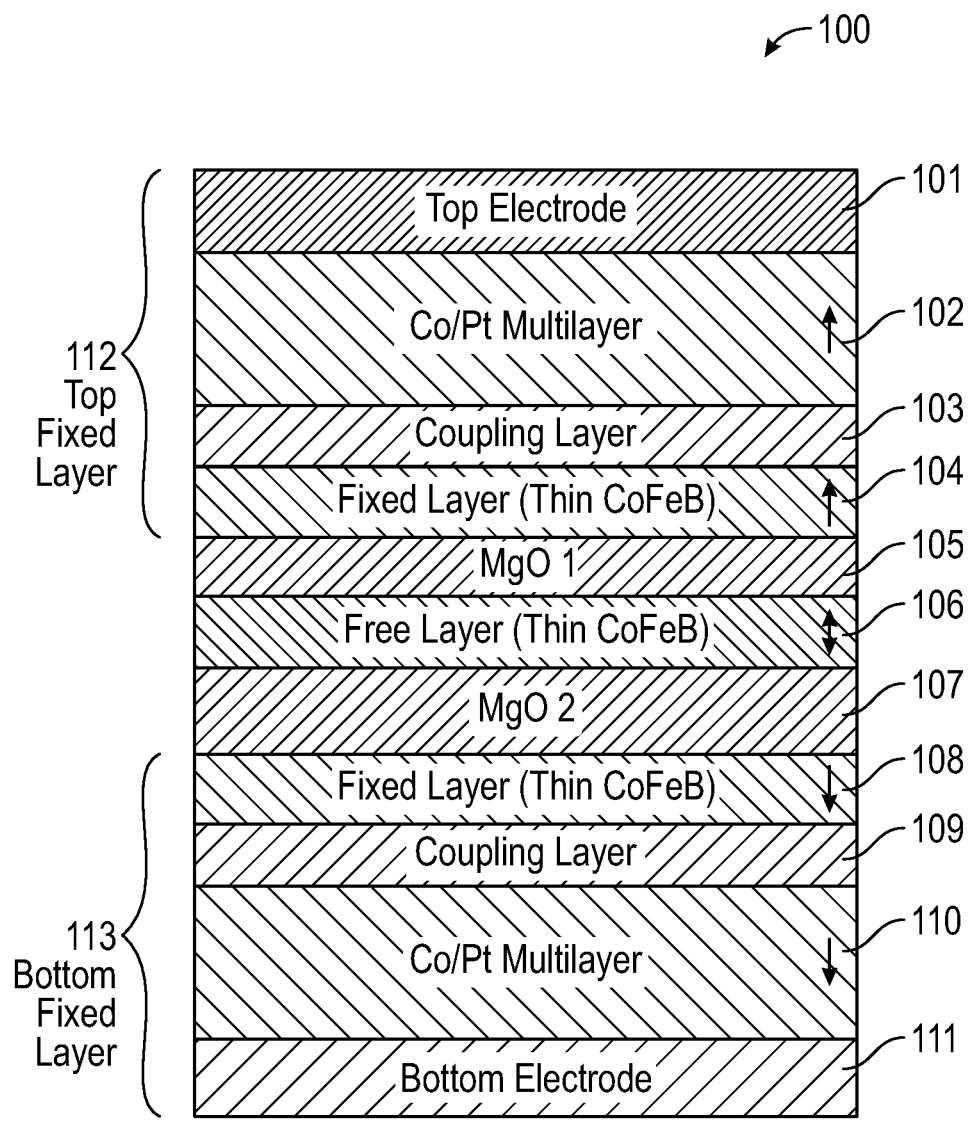
FIG. 1 includes a perpendicular magnetic tunnel junction (MTJ) in an embodiment of the invention.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

As described above, STTM has low power consumption and good scalability over conventional MRAM. However, STTMs can suffer from poor stability when aggressively scaled. Stability is one of the most important issues facing scaling of STTM based devices and memory arrays fabricated there from. As scaling continues, the need for smaller memory elements to fit into a scaled cell size has driven the industry in the direction of perpendicular STTMs, which have higher stability for small memory element sizes.

Common perpendicular STTMs are achieved with a material layer stack that includes a bottom electrode, a fixed magnetic layer, a dielectric layer (e.g., MgO), a free magnetic layer (e.g., CoFeB), a capping layer (e.g., Ta), and a top electrode. A magnetic tunnel junction (MTJ) portion of the material layer stack includes the fixed magnetic layer, the dielectric layer, and the free magnetic layer. A perpendicular STTM uses a perpendicular MTJ (pMTJ) as a memory element. This material stack is a basic material stack for fabricating STTM, and may be fabricated with greater complexity. For example, an anti-ferromagnetic layer may also be included between bottom electrode and fixed magnetic layer. Additionally, electrodes may themselves include multiple layers of material with differing properties. The material stack may, in its most basic form, be an in-plane system, where spins of the magnetic layers are in a same plane as the layers themselves.

Regarding pMTJs more specifically, with layer or interface engineering the material stack may be fabricated to provide a perpendicular spin system. In an example, a free magnetic layer (e.g., a free magnetic layer composed of CoFeB) is thinned down from a conventional thickness used for in-plane STTM devices. The extent of thinning may be sufficient such that a perpendicular component obtained from the iron/cobalt (Fe/Co) in the free magnetic layer interacting with oxygen in the dielectric layer (e.g., interacting with a magnesium oxide (MgO) layer) dominates over the in-plane component of the free CoFeB layer. This example provides a perpendicular system based on a single layer system of coupling to one interface of the free layer (i.e., the CoFeB—MgO interface). The degree of oxidation of surface iron/cobalt atoms (Fe/Co) in the CoFeB layer by oxygen from the MgO layer provides the strength (stability) of the free layer to have perpendicular-dominated spin states. Thickness of the fixed magnetic layer also determines magnetization direction in the same manner as in the thickness of a free magnetic layer. Other factors may also determine the direction of magnetization. For example, factors such as surface anisotropy (depending on the adjacent layers or a multi-layer composition of the ferromagnetic layer) and/or crystalline anisotropy (depending on stress and the crystal lattice structure modification such as FCC, BCC, or L10-type of crystals, where L10 is a type of crystal class which exhibits perpendicular magnetizations), can also determine the direction of magnetization.

The above described conventional stack fails to provide high stability. Stability is defined as the energy barrier between two magnetic states (e.g., (1, 0), (parallel, anti-parallel)). Stability is equal to the product of effective magnetic anisotropy ($K_{eff}$), thickness of free magnetic layer, and area of free magnetic layer. Applicant determined scalability of a pMTJ is a problem below 30 nm critical dimension (CD). For example, the thermal stability of the free layer drops significantly as junction diameter decreases (i.e., with scaling). A desired thermal stability or industry standard, such as 60 kT, may be required for commercial viability of any pMTJ memory device.

Thus, one or more embodiments are directed to increasing stability (e.g., thermal stability or the ability to maintain a memory state at expected operating temperatures) for the free layer of a pMTJ based device. Such a device includes, for example, a perpendicular STTM system. Applications may include use of pMTJs in embedded memory, embedded non-volatile memory (NVM), magnetic random access memory (MRAM), NVM, and non-embedded or stand-alone memories. Specifically, an embodiment increases stability for a pMTJ by addressing magnetization offset ($H_{offset}$) issues. More specifically, an embodiment provides symmetric stray fields (i.e., magnetic fields) for parallel (P) and anti-parallel (AP) states in a pMTJ. This has the effect of minimizing $H_{offset}$ as pMTJ area decreases (i.e., with aggressive scaling).

Following is a description of FIG. 1 and an embodiment of a novel pMTJ with increased stability. FIGS. 2A-D address how the embodiment of FIG. 1 increases stability by addressing ($H_{offset}$) issues.

FIG. 1 includes a pMTJ stack with top and bottom fixed layers (also referred to as pinned layers) 112, 113 sandwiching free layer 106 in the middle of stack 100. Stack 100 provides more symmetric magnetic fields from the fixed layers upon the free layer by including fixed layers on both sides of the free layer. Top electrode 101 is on multi-layer sublayer 102, such as a sublayer including alternating layers of Cobalt (Co) and Platinum (Pt). Layer 102 is on a coupling layer 103, which is sometimes also referred to as a buffer or spacer layer. Layer 103 is on fixed layer 104, which includes Co, Iron (Fe), and Boron (B). Collectively, layers 101, 102, 103, 104 comprise the top fixed layer 112. Top fixed layer 112 is on dielectric layer 105, which is on free layer 106. In an embodiment, free layer 106 can include a single CoFeB layer. However, in another embodiment free layer 106 includes a CoFeB/metal insert/CoFeB stack where the two CoFeB layers are magnetically coupled to each other through the metal insert or layer. Metal insert materials may include, for example, Ta, W, Mo, Hf, Ru, Pt, Cu, V, Cr, Nb, C, Mg, alloys of these metals, and nitrided or oxidized versions of these metals. Another dielectric layer 107 is below free layer 106. Dielectric layers 105, 107 may include Magnesium (Mg) and Oxygen (O) such as, for example, MgO. Bottom fixed layer 113 includes several sublayers including fixed layer 108, which includes CoFeB in some embodiments. Layer 108 is on coupling layer 109 and layer 110, which includes alternating sublayers Co and Pt. Layer 110 is on bottom electrode 111. Collectively layers 108, 109, 110, 111 are included within bottom fixed layer 113. Stack 100 provides fixed layers 112, 113 on both sides of free layer 106 in an effort to provide low to no $H_{offset}$.

Figure 2A:
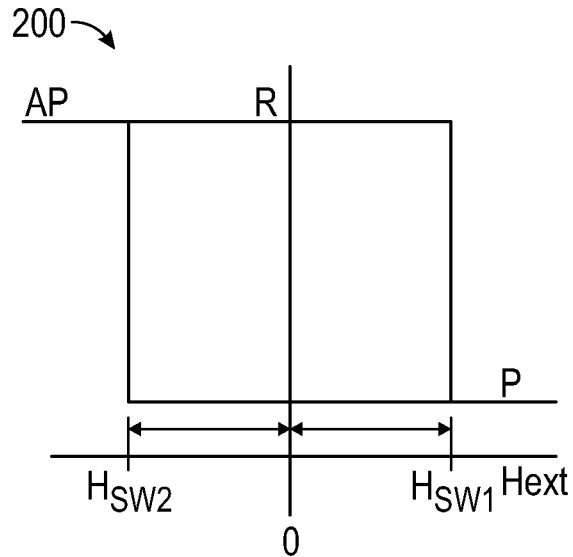
FIGS. 2A-D illustrate magnetic hysteresis plots.
Figure 2B:
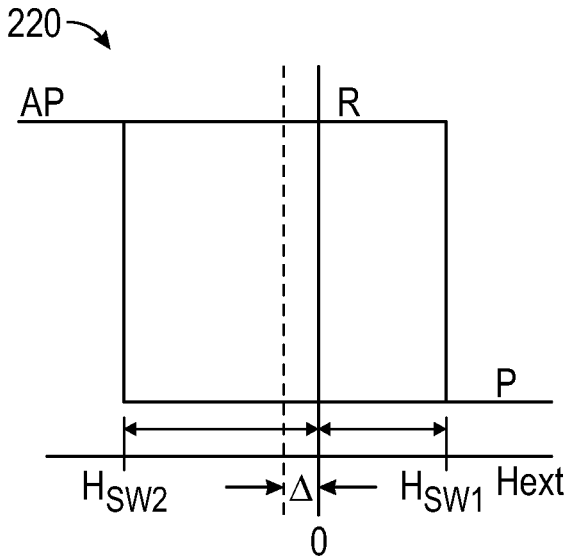
Figure 2C:
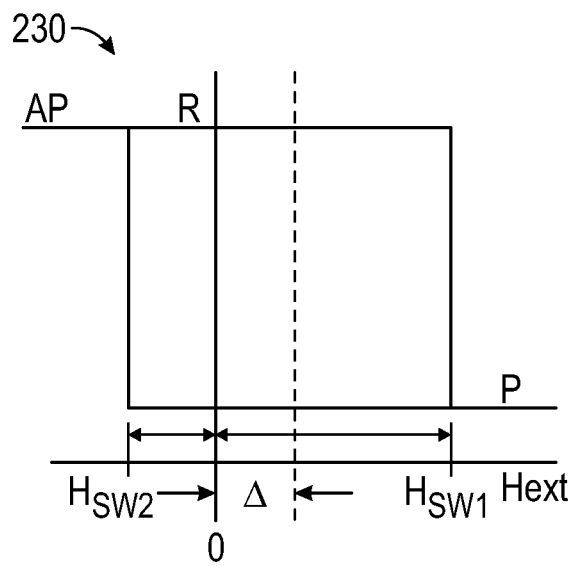
Figure 2D:
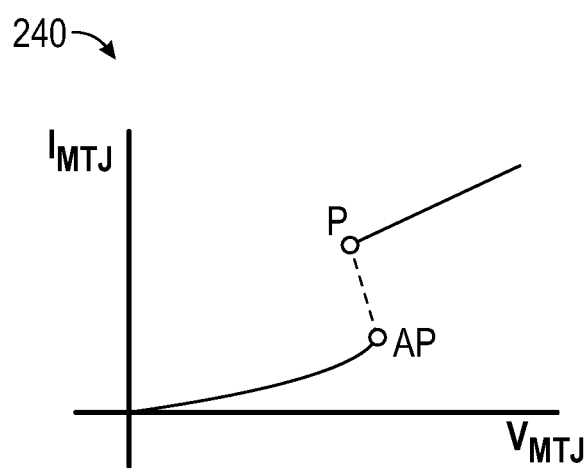

To help illustrate this, FIGS. 2A-C illustrate magnetic hysteresis plots 200, 220, and 230 showing zero and non-zero $H_{offset}$. FIG. 2A illustrates hysteresis plot 200 showing a fixed magnet with zero magnetic offset ($H_{offset}$). Here, x axis depicts a magnetic field ($H_{ext}$) that passes through a pMTJ, and the y axis depicts resistance across the pMTJ. High resistance occurs when the fixed magnet layer and free magnet layer of a pMTJ have anti-parallel (AP) magnetization orientations with regard to each other, while low resistance occurs when the fixed magnet layer and free magnet layer of a pMTJ have parallel (P) magnetization orientations with regard to one another. Switching states between AP and P orientations occurs at two separate magnetic switching fields—$H_{SW1}$ and $H_{SW2}$, where $H_{SW1}$ is a positive magnetic switching field and $H_{SW2}$ is a negative magnetic switching field. $H_{offset}$ can be expressed as:

$$\Delta = H_{offset} = (H_{SW1} + H_{SW2})/2$$

$H_{offset}$ shown in hysteresis plot 200 is zero because the magnitudes of $H_{SW1}$ and $H_{SW2}$ are equal relative to the zero point.

Embodiments described herein provide low to no $H_{offset}$ but other embodiments may provide $H_{offset}$ configured to be non-zero as described with reference to FIGS. 2B-C.

FIG. 2B illustrates hysteresis plot 220 showing a fixed magnet with negative $H_{offset}$. The $H_{offset}$ shown in hysteresis plot 220 is negative because the magnitude of $H_{SW2}$ is larger than the magnitude of $H_{SW1}$ relative to the zero point. The difference in the switching magnetic fields is $\Delta$. FIG. 2C illustrates plot 230 showing a fixed magnet with positive $H_{offset}$. The $H_{offset}$ shown in hysteresis plot 230 is positive because the magnitude of $H_{SW1}$ is larger than the magnitude of $H_{SW2}$ relative to the zero point. The difference in the switching magnetic fields is $\Delta$.

To provide a low $H_{offset}$ and the consequent similar stabilities for changing from AP to P and P to AP, embodiments employ fixed layers 112, 113 above and below fixed layer 106. Fixed layers 112, 113 are AP to one another to provide the desired low or no $H_{offset}$. Further, to provide these fixed layers 112, 113 in an AP state (see magnetic field arrows in FIG. 1 for layers 102, 104, 108, 110 to appreciate the AP relationship between layers 112, 113), embodiments provide different stabilities for fixed layers 112, 113. Such embodiments provide a different $K_{eff}$ (which relates to stability) for each of layers 112, 113, wherein $K_{eff} = Ki/t - Kb - Ms^2 u0/2$, where $K_{eff}$=effective perpendicular anisotropy, Ki=interface anisotropy for each of layers 112, 113, t=thickness for each of layers 112, 113, Kb=bulk anisotropy for each of layers 112, 113, Ms=saturation magnetization, u0=permittivity constant.

Layers 112, 113 include differing $K_{eff}$ values because of, for example, how stack 100 is formed. For example, FIG. 3 includes a method 300 in an embodiment of the invention. Block 305 includes forming a pMTJ stack including fixed layers above and below a free layer, wherein one of the fixed layers is more stable (e.g., more perpendicular magnetic anisotropy such as a higher $K_{eff}$) than the other fixed layer. Both fixed layers are more stable than the free layer. Block 310 includes magnetic soaking the stack to orientate the magnetization of both pinned layers in a first direction. For example, such a soak may entail placing the pMTJ stack in a chamber with a large magnetic field and then allowing the stack to remain there. Block 315 includes exposing the fixed layers to a large polarized (e.g., negative) external field so the moments of the fixed layers lie in the same direction (e.g., spin down). Block 320 includes exposing the fixed layers to a polarized external field so that the less stable of the two fixed layers reverses its magnetic moment (e.g., changes from spin down to spin up) but the more stable of the two fixed layers maintains its previous magnetic moment to orient the two fixed layers in an AP orientation. At more positive external fields, the moments in the free layer and top pinned/fixed layer film orient into an AP direction (spin up) with regard to the other pinned/fixed layer. In operation of the pMTJ, the TMR for the pMTJ is based on the magnetic orientation of the free layer with regard to the more stable of the two fixed layers. The stack may be annealed in some embodiments.

Thus, the two fixed layers require differing $K_{eff}$ so they can be oriented AP to each other and consequently offset (or nearly offset) each other's magnetic influence on the sandwiched free layer. Differing $K_{eff}$ are obtained via any of several ways. For example, layer 113 may be made more stable than layer 112 by any or all or some subset of: (1) employing thicker Pt sublayers in layer 110 than in layer 102, (2) employing a greater number of Pt sublayers in layer 110 than in layer 102, (3) employing a greater diameter for layer 113 than layer 112, and/or (4) employing materials (e.g., rare earth/transition metal alloys such as TbFeCo and GdFeCo) that have greater anisotropy for layer 113 than layer 112.

In an embodiment care is taken such that the CoFeB fixed layer 104 crystallinity is not affected by the stronger fixed layer 108 magnet and/or layer 113. A coupling layer, such as layer 103, can be used to block the crystallinity of the stronger fixed layer 108 and/or layer 113. The coupling layer 103 may be amorphous. However, in an embodiment "margin" may be increased (i.e., stack magnetic and crystalline properties may be improved) by expanding the fixed layer 104 to include a thicker fixed layer. Such a thicker layer may include CoFeB/nonmagnetic metal insert/CoFeB (as described above with regard to free layer 106). Thus, layer 104 may be a single CoFeB layer in some embodiments or a CoFeB/metal insert/CoFeB multilayer layer in other embodiments.

In an embodiment, stack 100 may be located on a substrate, which may include Silicon (Si), SiGe, and the like. The substrate may include a semiconductor on insulator (SOI) substrate. The insulator may include $SiO_2$ or the like. In an embodiment the substrate has a height or thickness of 100 nm. "Thickness" or "height" as used herein is in the vertical direction of FIG. 1, whereas "width" would be in the horizontal direction of FIG. 1. Also, electrode 101 is on "top" of electrode 111. In some embodiments layers 104, 106, 108 include CoFeB in varying combinations such as, for example, $Co_{20}Fe_{60}B_{20}$. Layers 104, 106, 108 may be 1 nm thick in some embodiments. Dielectric layers 105, 107 may include MgO and may be 1 nm thick. Free layer 106 may include sublayers (not shown). In an embodiment of stack 100, layer 101 may be 10 nm thick, layer 102 may be 5 nm thick and include Co/Pt. Layer 103 may be 1-3 angstroms thick and include Ta, W, Mo, Hf, Ru, Pt, Cu, V, Cr, Nb, C, Mg, alloys of these metals, and nitrided or oxidized versions of these metals (however other embodiments are not so limited). Layer 104 may be 1-2 nm thick and include CoFeB and rare earth/transition metal alloys such as TbFeCo and GdFeCo, layer 105 may be 1 nm thick and include MgO, layer 106 may be 1-2 nm thick and include CoFeB and Ta, W, Mo, Hf, Ru, Pt, Cu, V, Cr, Nb, C, Mg, alloys of these metals, and nitrided or oxidized versions of these metals, layer 107 may be 1 nm thick and include MgO, layer 108 may be 1-2 nm thick and include CoFeB and rare earth/transition metal alloys such as TbFeCo and GdFeCo. Layer 109 may be less than 1 nm thick and include Ta, W, Mo, Hf, Ru, Pt, Cu, V, Cr, Nb, C, Mg, alloys of these metals, and nitrided or oxidized versions of these metals (however other embodiments are not so limited). Layer 110 may be 5 nm thick and include Co/Pt, and layer 111 may be 10 nm thick and include Ta, TaN, Ru, CuN, W, TiN, Ti, other common back-end metals.

In an embodiment the pMTJ stack is crystallized after an anneal step at a high temperature. This way the MgO can crystallize and act as a template for the free and fixed CoFeB layers. Thus, an embodiment has free and fixed layers that are crystalline in the same texture as MgO (e.g., BCC 100). Various embodiments disclosed herein have addressed pMTJs. Any such pMTJ may be used in a memory cell by coupling one portion or node of the pMTJ stack (e.g., top electrode 101 of FIG. 1) to a bit-line and another node of the pMTJ stack (e.g., bottom electrode 111 of FIG. 1) to a source or drain node of a switching device, such as a selection transistor. The other of the source and drain node of the selection transistor may be coupled to a source line of the memory cell. The gate of the selection transistor may couple to a word-line. Such a memory cell may utilize TMR of the pMTJ to store memory states. Embodiments provided herein provide an increase in stability for the memory states. Such embodiments subsequently provide more stable and power efficient memory cells that can be scaled below, for example, 22 nm CD. The STT memory cell may couple to a sense amplifier. A plurality of the STT memory bit cells may be operably connected to one another to form a memory array, wherein the memory array can be incorporated into a non-volatile memory device. It is to be understood that the selection transistor may be connected to the top electrode or the bottom electrode of a pMTJ stack.

Figure 4:
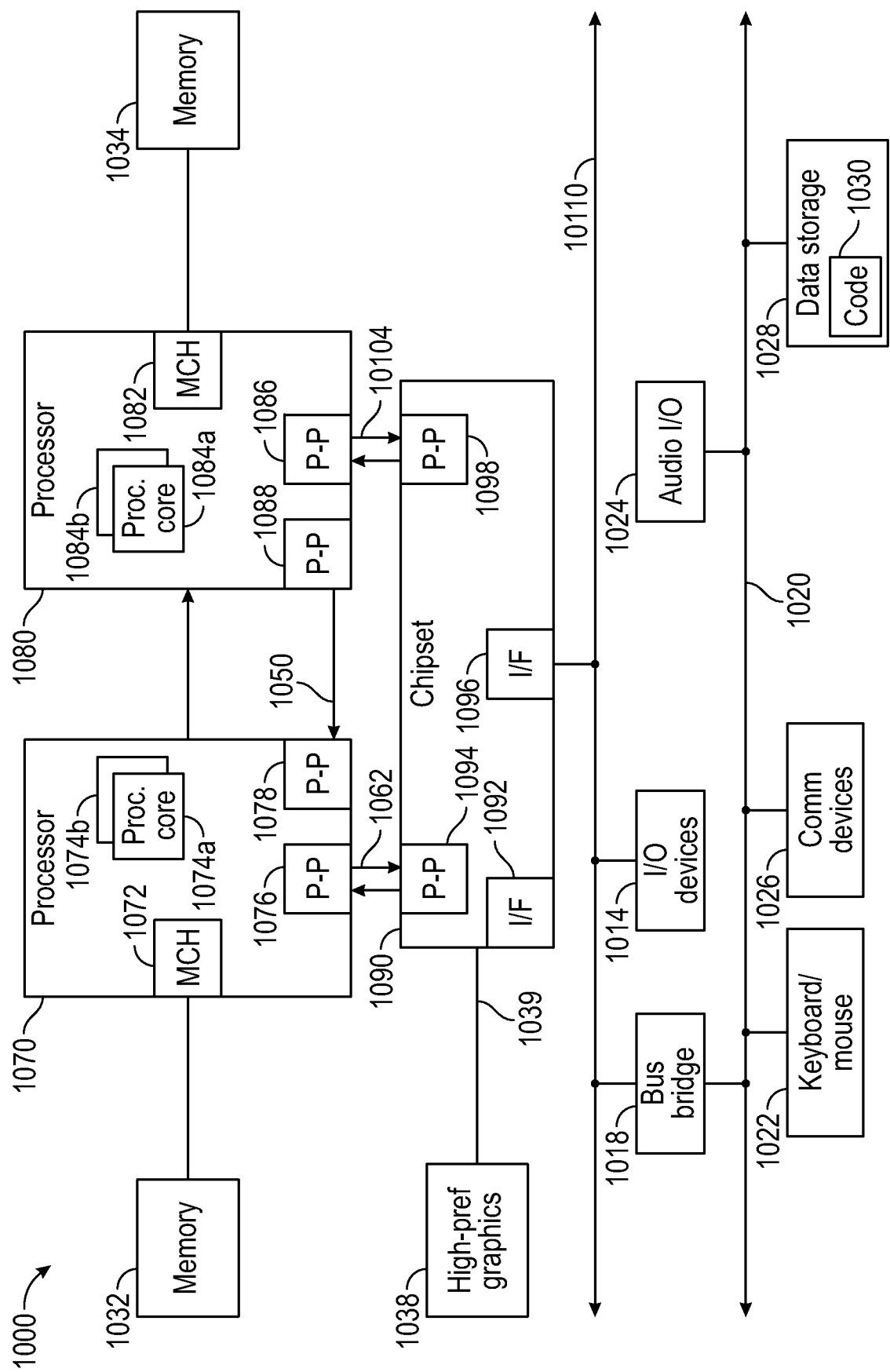
FIG. 4 includes a system comprising a memory cell within which an embodiment of the invention is included.

FIG. 4 includes a system that may include the above described memory cell. FIG. 4 includes a block diagram of a system embodiment 1000 in accordance with an embodiment of the present invention. System 1000 may include hundreds or thousands of the above described memory cells and be critical to memory functions in system 1000. System 1000 may include, for example, a mobile computing node such as a cellular phone, smartphone, tablet, Ultrabook®, notebook, laptop, personal digital assistant, and mobile processor based platform. The stability and power efficiency of such memory cells accumulates when the memory cells are deployed in mass and provides significant performance advantages (e.g., longer battery life, longer memory state storage in a broader range of operating temperatures) to such computing nodes.

Shown is a multiprocessor system 1000 that includes a first processing element 1070 and a second processing element 1080. While two processing elements 1070 and 1080 are shown, it is to be understood that an embodiment of system 1000 may also include only one such processing element. System 1000 is illustrated as a point-to-point interconnect system, wherein the first processing element 1070 and second processing element 1080 are coupled via a point-to-point interconnect 1050. It should be understood that any or all of the interconnects illustrated may be implemented as a multi-drop bus rather than point-to-point interconnect. As shown, each of processing elements 1070 and 1080 may be multicore processors, including first and second processor cores (i.e., processor cores 1074*a* and 1074*b* and processor cores 1084*a* and 1084*b*). Such cores 1074, 1074*b*, 1084*a*, 1084*b* may be configured to execute instruction code.

Each processing element 1070, 1080 may include at least one shared cache or memory unit which may include pMTJs described herein. The shared cache may store data (e.g., instructions) that are utilized by one or more components of the processor, such as the cores 1074*a*, 1074*b* and 1084*a*, 1084*b*, respectively. For example, the shared cache may locally cache data stored in a memory 1032, 1034 for faster access by components of the processor. In one or more embodiments, the shared cache may include one or more mid-level caches, such as level 2 (L2), level 3 (L3), level 4 (L4), or other levels of cache, a last level cache (LLC), and/or combinations thereof.

While shown with only two processing elements 1070, 1080, it is to be understood that the scope of the present invention is not so limited. In other embodiments, one or more additional processing elements may be present in a given processor. Alternatively, one or more of processing elements 1070, 1080 may be an element other than a processor, such as an accelerator or a field programmable gate array. For example, additional processing element(s) may include additional processors(s) that are the same as a first processor 1070, additional processor(s) that are heterogeneous or asymmetric to first processor 1070, accelerators (such as, e.g., graphics accelerators or digital signal processing (DSP) units), field programmable gate arrays, or any other processing element. There can be a variety of differences between the processing elements 1070, 1080 in terms of a spectrum of metrics of merit including architectural, microarchitectural, thermal, power consumption characteristics, and the like. These differences may effectively manifest themselves as asymmetry and heterogeneity amongst the processing elements 1070, 1080. For at least one embodiment, the various processing elements 1070, 1080 may reside in the same die package.

First processing element 1070 may further include memory controller logic (MC) 1072 and point-to-point (P-P) interfaces 1076 and 1078. Similarly, second processing element 1080 may include a MC 1082 and P-P interfaces 1086 and 1088. MC's 1072 and 1082 couple the processors to respective memories, namely a memory 1032 and a memory 1034, which may be portions of main memory locally attached to the respective processors. Memory 1032, 1024 may include pMTJs described herein. While MC logic 1072 and 1082 is illustrated as integrated into the processing elements 1070, 1080, for alternative embodiments the MC logic may be discreet logic outside the processing elements 1070, 1080 rather than integrated therein.

First processing element 1070 and second processing element 1080 may be coupled to an I/O subsystem 1090 via P-P interfaces 1076, 1086 via P-P interconnects 1062, 10104, respectively. As shown, I/O subsystem 1090 includes P-P interfaces 1094 and 1098. Furthermore, I/O subsystem 1090 includes an interface 1092 to couple I/O subsystem 1090 with a high performance graphics engine 1038. In one embodiment, a bus may be used to couple graphics engine 1038 to I/O subsystem 1090. Alternately, a point-to-point interconnect 1039 may couple these components.

In turn, I/O subsystem 1090 may be coupled to a first bus 10110 via an interface 1096. In one embodiment, first bus 10110 may be a Peripheral Component Interconnect (PCI) bus, or a bus such as a PCI Express bus or another third generation I/O interconnect bus, although the scope of the present invention is not so limited.

As shown, various I/O devices 1014, 1024 may be coupled to first bus 10110, along with a bus bridge 1018 which may couple first bus 10110 to a second bus 1020. In one embodiment, second bus 1020 may be a low pin count (LPC) bus. Various devices may be coupled to second bus 1020 including, for example, a keyboard/mouse 1022, communication device(s) 1026 (which may in turn be in communication with a computer network), and a data storage unit 1028 such as a disk drive or other mass storage device which may include code 1030, in one embodiment. The code 1030 may include instructions for performing embodiments of one or more of the methods described above. Further, an audio I/O 1024 may be coupled to second bus 1020.

Note that other embodiments are contemplated. For example, instead of the point-to-point architecture shown, a system may implement a multi-drop bus or another such communication topology. Also, the elements of FIG. 4 may alternatively be partitioned using more or fewer integrated chips than shown in the FIG. 4. For example, a field programmable gate array may share a single wafer with a processor element and memory including MTJs described herein.

As used herein, a "free" magnetic layer is a magnetic layer storing a computational variable. A "fixed" magnetic layer is a magnetic layer with fixed magnetization (magnetically harder than the free magnetic layer). A tunneling barrier, such as a tunneling dielectric (e.g., MgO) or tunneling oxide, is one located between free and fixed magnetic layers. A fixed magnetic layer may be patterned to create inputs and outputs to an associated circuit. Magnetization may be written by spin transfer torque effect while passing a current through the input electrodes. Magnetization may be read via the TMR effect while applying voltage to the output electrodes. In an embodiment, the role of the dielectric layer (e.g., dielectric layers 105, 107) is to cause a large magneto-resistance ratio. The magneto-resistance is the ratio of the difference between resistances when the two ferromagnetic layers have AP magnetizations and the resistance of the state with the parallel magnetizations.

MTJs described herein, such as pMTJs, function essentially as a resistor, where the resistance of an electrical path through the MTJ may exist in two resistive states, either "high" or "low," depending on the direction or orientation of magnetization in the free magnetic layer(s) (embodiments may have one or more free layers) and in the fixed magnetic layers. In the case that the spin direction is down (minority) in the free magnetic layer, a high resistive state exists, wherein direction of magnetization in the coupled free magnetic layer(s) and the dominant (i.e., most stable) fixed magnetic layer are substantially opposed or AP with one another. In the case that the spin direction is up (majority) in the coupled free magnetic layer(s), a low resistive state exists, wherein the direction of magnetization in the coupled free magnetic layer(s) and the dominant fixed magnetic layer (e.g., thickest Pt layer or more number Pt layers) is substantially aligned or P with one another. It is to be understood that the terms "low" and "high" with regard to the resistive state of the MTJ are relative to one another. In other words, the high resistive state is merely a detectibly higher resistance than the low resistive state, and vice versa. Thus, with a detectible difference in resistance, the low and high resistive states can represent different bits of information (i.e. a "0" or a "1").

The direction of magnetization in the coupled free magnetic layers may be switched through STT using a spin-polarized current. An electrical current is generally non-polarized (e.g. consisting of about 50% spin-up and about 50% spin-down electrons). A spin polarized current is one with a greater number of electrons of either spin-up or spin-down, which may be generated by passing a current through the fixed magnetic layers. The electrons of the spin polarized current from the fixed magnetic layers tunnel through the tunneling barrier or dielectric layers and transfers its spin angular momentum to the free magnetic layer, wherein the free magnetic layer will orient its magnetic direction from AP to that of the dominant fixed magnetic layer or P. The free magnetic layer may be returned to its original orientation by reversing the current.

Thus, the pMTJ may store a single bit of information ("0" or "1") by its state of magnetization. The information stored in the MTJ is sensed by driving a current through the pMTJ. The free magnetic layer(s) does not require power to retain its magnetic orientations. As such, the state of the MTJ is preserved when power to the device is removed. Therefore, a STT memory bit cell composed of stack 100, is, in an embodiment, non-volatile.

Various embodiments addressed herein include a semiconductive substrate. Such a substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

The following examples pertain to further embodiments.

Example 1 includes an apparatus comprising: a substrate; a perpendicular magnetic tunnel junction (pMTJ), on the substrate, comprising a first fixed layer, a second fixed layer, and a free layer between the first and second fixed layers; a first dielectric layer between the first fixed layer and the free layer; and a second dielectric layer between the second fixed layer and the free layer.

The free layer may include sublayers. As used in the examples, stating a "layer" is in a stack does not necessarily indicate the layer does or does not include sublayers.

In example 2 the subject matter of the Example 1 can optionally include wherein the first dielectric layer directly contacts the first fixed layer and the free layer; and the second dielectric layer directly contacts the second fixed layer and the free layer.

In example 3 the subject matter of the Examples 1-2 can optionally include wherein the first and second dielectric layers each include magnesium (Mg) and oxygen (O), the first and second fixed layers each include Cobalt (Co), Iron (Fe), and Boron (B), and the free layer includes Co, Fe, and B.

In an embodiment the free layer(s) includes CoFeB and at least one of Ta, W, Mo, Hf, Ru, Pt, Cu, V, Cr, Nb, C, Mg, alloys of these metals, and nitrided or oxidized versions of these metals. In an embodiment the fixed layers include a hard magnet coupled to CoFeB fixed layer and the hard magnet portion may include rare earth/transition metal alloys such as TbFeCo and GdFeCo.

In example 4 the subject matter of the Examples 1-3 can optionally include wherein the first fixed layer includes a first sublayer comprising Co and another first sublayer comprising Platinum (Pt) and the second fixed layer includes a second sublayer comprising Co and another second sublayer comprising Pt.

In example 5 the subject matter of the Examples 1-4 can optionally include wherein (a) the first fixed layer includes first sublayers and the second fixed layer includes second sublayers, (b) the first fixed layer has a first fixed layer effective anisotropy constant ($K_{eff}$), the second fixed layer has a second fixed layer $K_{eff}$, and the free layer has a free layer $K_{eff}$, and (c) the first fixed layer $K_{eff}$ is greater than the second fixed layer $K_{eff}$.

In example 6 the subject matter of the Examples 1-5 can optionally include wherein the first fixed layer is anti-parallel to the second fixed layer.

In example 7 the subject matter of the Examples 1-6 can optionally include wherein the first fixed layer is thicker than the second fixed layer.

As noted above, "thickness" would be measured along an axis running between the electrodes of FIG. 1.

In example 8 the subject matter of the Examples 1-7 can optionally include wherein the first fixed layer includes more sublayers than the second fixed layer.

For example, more sublayers may include more alternating layers of Co and Pt.

In example 9 the subject matter of the Examples 1-8 can optionally include wherein (a) the first fixed layer includes a sublayer, comprising Cobalt (Co), Iron (Fe), and Boron (B), and an additional sublayer comprising an electrode; and (b) the sublayer and the additional sublayer are on opposing ends of the first fixed layer.

In example 10 the subject matter of the Examples 1-9 can optionally include wherein tunnel magnetoresistance (TMR) of the pMTJ is based on whether the free layer is anti-parallel to the first fixed sublayer.

For example, as explained above, layer 113 may have a greater $K_{eff}$ than layer 112. In such an instance the TMR of stack 100 would be most influenced by whether free layer 106 is P or AP to layer 113 (rather than the less stable layer 112). In this example, layer 113 is the "dominant" fixed layer.

Furthermore, continuing to use stack 100 as an example, stack 100 includes MgO layers 105, 107. One dielectric layer dominates (i.e., is more resistive) over the other dielectric layer. The less dominant layer acts mostly as a resistive short instead of determining memory state based on TMR. For example, if bottom MgO layer 107 resistance is far greater (i.e., more dominant) than top MgO layer 105 resistance, then the bottom fixed and free layer interactions determine whether the state for stack 100 is P or AP. The MgO layer's resistance is determined by the stability/$K_{eff}$ of the fixed layer closest to it (i.e., layer 107 resistance is determined by layer 113). The top fixed layer and top MgO act as a resistive short, which can act as a series resistance. In an embodiment this series resistance is small (e.g., <1 kohm) in order to avoid degrading TMR too much.

Note that, as explained with Example 19 below, a top dielectric layer (e.g., similar to layer 105) can be replaced by a non-magnetic metallic film. However, other embodiments (e.g., stack 100) use MgO to reduce damping (and write current) and improve anisotropy compared to metal films inserted between the free and top fixed layers.

In example 11 the subject matter of the Examples 1-10 can optionally include wherein tunnel magnetoresistance (TMR) of the pMTJ is based on whether the free layer is anti-parallel to the first fixed sublayer and is not based on whether the free layer is anti-parallel to the second fixed sublayer.

Thus, the AP or P state may be influenced by the second fixed layer but that influence is surpassed by the influence from the more stable first fixed sublayer.

In example 12 the subject matter of the Examples 1-11 can optionally include wherein tunnel magnetoresistance (TMR) of the pMTJ is more heavily influenced by (a) whether the free layer is anti-parallel to the first fixed sublayer, than (b) whether the free layer is anti-parallel to the second fixed sublayer.

In example 13 the subject matter of the Examples 1-12 can optionally include wherein the second fixed layer Keff is greater than the free layer Keff.

In example 14 the subject matter of the Examples 1-13 can optionally include wherein $K_{eff}=Ki/t-Kb-Ms^2u0/2$, where $K_{eff}$=effective perpendicular anisotropy, Ki=interface anisotropy, t=thickness, Kb=bulk anisotropy, Ms=saturation magnetization, u0=permittivity constant.

In example 15 the subject matter of the Examples 1-14 can optionally include wherein the first fixed layer is anti-parallel to the second fixed layer.

In example 16 the subject matter of the Examples 1-14 can optionally include a system comprising: a processor; a memory, coupled to the processor, including an apparatus according to any one of examples 1 to 15; and a communication module, coupled to the processor, to communicate with a computing node external to the system.

A communications module may include, for example, element 1026 of FIG. 4, a wireless radio interface, antennae, OFDM module, and the like.

In example 17 the subject matter of the Examples 1-16 can optionally include a mobile computing node including a non-volatile memory that comprises the pMTJ.

Such a node may include Smartphone or wearable device included in the Internet of Things.

Example 18 includes an apparatus comprising: a substrate; a perpendicular magnetic tunnel junction (pMTJ), on the substrate, comprising a first fixed layer, a second fixed layer, and a free layer between the first and second fixed layers; a first dielectric layer between the first fixed layer and the free layer; and a second layer between the second fixed layer and the free layer.

In example 19 the subject matter of the Example 18 can optionally include wherein the second layer includes at least one of a dielectric layer and a non-magnetic metallic film.

In example 20 the subject matter of the Examples 18-19 can optionally include, wherein the first fixed layer has a first fixed layer effective anisotropy constant ($K_{eff}$), the second fixed layer has a second fixed layer $K_{eff}$, and the first fixed layer $K_{eff}$ is greater than the second fixed layer $K_{eff}$.

In example 21 the subject matter of the Examples 1-17 can optionally include, wherein the free layer includes a sublayer including CoFeB and another sublayer includes a metal selected from the group comprising Ta, W, Mo, Hf, Ru, Pt, Cu, V, Cr, Nb, C, Mg.

By stating the sublayer may include a metal such as Ta, W, Mo, Hf, Ru, Pt, Cu, V, Cr, Nb, C, Mg, this also includes alloys of these metals, and nitrided or oxidized versions of these metals.

In example 22 the subject matter of the Examples 1-17 and 21 can optionally include an amorphous coupling layer directly contacting the first fixed layer.

In another version of example 22 the subject matter of the Examples 1-17 and 21 can optionally include an amorphous coupling layer directly contacting the first fixed layer or the second fixed layer.

In another version of example 22 the subject matter of the Examples 1-17 and 21 can optionally include an amorphous coupling layer directly contacting the first fixed layer and another amorphous coupling layer directly contacting the second fixed layer.

In example 23 the subject matter of the Examples 1-17 and 21-22 can optionally include wherein each of the first fixed layer, second fixed layer, and the free layer have a CoFeB portion that has a body-centered cubic (BCC) 100 lattice structure.

For example, in the fixed layer there may be other materials (e.g., Co/Pt) which are not necessarily BCC100.

Example 24 includes a method comprising: forming a perpendicular magnetic tunnel junction (pMTJ) stack including first and second fixed layers above and below a free layer; orienting the magnetization of the first and second fixed layers in a first direction; and orienting the magnetization of the first fixed layer, but not the second fixed layer, anti-parallel (AP) to the first direction; wherein the first fixed layer has a first fixed layer effective anisotropy constant ($K_{eff}$), the second fixed layer has a second fixed layer $K_{eff}$, and the first fixed layer $K_{eff}$ is greater than the second fixed layer $K_{eff}$.

In example 25 the subject matter of the Example 24 can optionally include determining tunnel magnetoresistance (TMR) of the pMTJ based more heavily on (a) whether the free layer is anti-parallel to the first fixed sublayer, than (b) whether the free layer is anti-parallel to the second fixed sublayer.

As used herein, "symmetric" fixed layers does not necessarily mean the fixed layers must be the same distance from any free layer located between the fixed layers. Nor does this imply that other total number of fixed layers one either side of the free layer must be exactly equal.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
   a substrate;
   a perpendicular magnetic tunnel junction (pMTJ), on the substrate, comprising a first fixed layer, a second fixed layer, and a free layer between the first and second fixed layers;
   a first dielectric layer between the first fixed layer and the free layer; and a second dielectric layer between the second fixed layer and the free layer;

wherein the first fixed layer is anti-parallel to the second fixed layer.

2. The apparatus of claim 1, wherein the first dielectric layer directly contacts the first fixed layer and the free layer; and the second dielectric layer directly contacts the second fixed layer and the free layer.

3. The apparatus of claim 2, wherein the first and second dielectric layers each include magnesium (Mg) and oxygen (O), the first and second fixed layers each include Cobalt (Co), Iron (Fe), and Boron (B), and the free layer includes Co, Fe, and B.

4. The apparatus of claim 2, wherein the first fixed layer includes a first sublayer comprising Cobalt (Co) and another first sublayer comprising Platinum (Pt) and the second fixed layer includes a second sublayer comprising Co and another second sublayer comprising Pt.

5. The apparatus of claim 2, wherein (a) the first fixed layer includes first sublayers and the second fixed layer includes second sublayers, (b) the first fixed layer has a first fixed layer effective anisotropy constant (Keff), the second fixed layer has a second fixed layer Keff, and the free layer has a free layer Keff, and (c) the first fixed layer Keff is greater than the second fixed layer Keff.

6. The apparatus of claim 5, wherein the second fixed layer Keff is greater than the free layer Keff.

7. The apparatus of claim 5, wherein Keff=Ki/t–Kb–Ms2u0/2, where Keff=effective perpendicular anisotropy, Ki=interface anisotropy, t=thickness, Kb=bulk anisotropy, Ms=saturation magnetization, u0=permittivity constant.

8. The apparatus of claim 1, wherein the first fixed layer is thicker than the second fixed layer.

9. The apparatus of claim 1, wherein the first fixed layer includes more sublayers than the second fixed layer.

10. The apparatus of claim 1, wherein (a) the first fixed layer includes a sublayer, comprising Cobalt (Co), Iron (Fe), and Boron (B), and an additional sublayer comprising an electrode; and (b) the sublayer and the additional sublayer are on opposing ends of the first fixed layer.

11. The apparatus of claim 1, wherein tunnel magnetoresistance (TMR) of the pMTJ is based on whether the free layer is anti-parallel to the first fixed sublayer.

12. The apparatus of claim 1, wherein tunnel magnetoresistance (TMR) of the pMTJ is based on whether the free layer is anti-parallel to the first fixed sublayer and is not based on whether the free layer is anti-parallel to the second fixed sublayer.

13. The apparatus of claim 1, wherein tunnel magnetoresistance (TMR) of the pMTJ is more heavily influenced by (a) whether the free layer is anti-parallel to the first fixed sublayer, than (b) whether the free layer is anti-parallel to the second fixed sublayer.

14. The apparatus of claim 1 comprising an amorphous coupling layer directly contacting the first fixed layer.

15. The apparatus of claim 1, wherein each of the first fixed layer, the second fixed layer, and the free layer have a CoFeB portion that has a body-centered cubic (BCC) 100 lattice structure.

16. A system comprising:
a processor;
a memory, coupled to the processor, including an apparatus according to claim 1; and
a communication module, coupled to the processor, to communicate with a computing node external to the system.

17. The apparatus of claim 1 comprising a mobile computing node including a non-volatile memory that comprises the pMTJ.

18. The apparatus of claim 1, wherein the free layer includes a sublayer including CoFeB and another sublayer including at least one of Ta, W, Mo, Hf, Ru, Pt, Cu, V, Cr, Nb, C, Mg, or combinations thereof.

19. An apparatus comprising:
a substrate;
a perpendicular magnetic tunnel junction (pMTJ), on the substrate, comprising a first fixed layer, a second fixed layer, and a free layer between the first and second fixed layers;
a first dielectric layer between the first fixed layer and the free layer; and
a second layer between the second fixed layer and the free layer;
wherein the first fixed layer has a first fixed layer effective anisotropy constant (Keff), the second fixed layer has a second fixed layer Keff, and the first fixed layer Keff is greater than the second fixed layer Keff.

20. The apparatus of claim 19, wherein the second layer includes at least one of a dielectric layer and a non-magnetic metallic film.

21. The apparatus of claim 20, wherein the first dielectric layer directly contacts the first fixed layer and the free layer; and the second dielectric layer directly contacts the second fixed layer and the free layer.

22. An apparatus comprising:
a substrate;
a perpendicular magnetic tunnel junction (pMTJ), on the substrate, comprising a first fixed layer, a second fixed layer, and a free layer between the first and second fixed layers;
a first dielectric layer between the first fixed layer and the free layer;
a second dielectric layer between the second fixed layer and the free layer; and
a mobile computing node including a non-volatile memory that comprises the pMTJ.

23. The apparatus of claim 22, wherein the first dielectric layer directly contacts the first fixed layer and the free layer; and the second dielectric layer directly contacts the second fixed layer and the free layer.

24. The apparatus of claim 23, wherein the first and second dielectric layers each include magnesium (Mg) and oxygen (O), the first and second fixed layers each include Cobalt (Co), Iron (Fe), and Boron (B), and the free layer includes Co, Fe, and B.

25. The apparatus of claim 23, wherein the first fixed layer includes a first sublayer comprising Cobalt (Co) and another first sublayer comprising Platinum (Pt) and the second fixed layer includes a second sublayer comprising Co and another second sublayer comprising Pt.

* * * * *